(12) United States Patent
Hencken et al.

(10) Patent No.: US 10,302,702 B2
(45) Date of Patent: May 28, 2019

(54) MONITORING OF PRIMARY DEVICES IN A POWER SYSTEM

(71) Applicant: ABB RESEARCH LTD, Zürich (CH)

(72) Inventors: Kai Hencken, Lörrach (DE); Daniel Schrag, Lufingen (CH); Peter Krippner, Karlsruhe (DE); Carlo Gemme, Pavia (IT); Marco Egman, Ponte San Pietro (IT); Jarkko Makela, Seinajoki (FI)

(73) Assignee: ABB Research Ltd, Zurich (CH)

( * ) Notice: Subject to any disclaimer, the term of this patent is extended or adjusted under 35 U.S.C. 154(b) by 628 days.

(21) Appl. No.: 14/450,016

(22) Filed: Aug. 1, 2014

(65) Prior Publication Data

US 2014/0343895 A1 Nov. 20, 2014

Related U.S. Application Data

(63) Continuation of application No. PCT/EP2012/051693, filed on Feb. 1, 2012.

(51) Int. Cl.
*G01R 31/02* (2006.01)
*G05B 23/02* (2006.01)
*G01R 31/327* (2006.01)

(52) U.S. Cl.
CPC ......... *G01R 31/327* (2013.01); *G01R 31/027* (2013.01); *G05B 23/0224* (2013.01)

(58) Field of Classification Search
CPC .................................................. G05B 23/0224
See application file for complete search history.

(56) References Cited

U.S. PATENT DOCUMENTS

| 5,999,894 A | 12/1999 | Mederer et al. |
| 6,108,615 A | 8/2000 | Fuehring et al. |
| 2008/0141072 A1* | 6/2008 | Kalgren .................. G01D 3/08 714/33 |
| 2010/0100521 A1 | 4/2010 | Fujimaki et al. |
| 2010/0131800 A1 | 5/2010 | Fujimaki et al. |

OTHER PUBLICATIONS

International Search Report (PCT/ISA/210) dated Oct. 26, 2012, by the European Patent Office as the International Searching Authority for International Application No. PCT/EP2012/051693.
Written Opinion (PCT/ISA/237) dated Oct. 26, 2012, by the European Patent Office as the International Searching Authority for International Application No. PCT/EP2012/051693.

* cited by examiner

*Primary Examiner* — Manuel A Rivera Vargas
(74) *Attorney, Agent, or Firm* — Taft Stettinius & Hollister LLP; J. Bruce Schelkopf

(57) ABSTRACT

For monitoring diagnostic rules of a power system, an exemplary method is disclosed and includes collecting operational diagnostic data from a first primary device; identifying a change of a diagnostic indicator based on the operational diagnostic data; adapting a diagnostic rule to the identified change, wherein the diagnostic rule is applicable to the diagnostic data for determining a diagnostic warning which indicates a diagnostic state of a primary device; and providing a diagnostic warning of a second primary device by applying the adapted diagnostic rule to operational diagnostic data collected for the second primary device.

20 Claims, 2 Drawing Sheets

MONITORING OF PRIMARY DEVICES IN A POWER SYSTEM

RELATED APPLICATION

This application claims priority as a continuation application under 35 U.S.C. § 120 to PCT/EP2012/051693 filed as an International Application on Feb. 1, 2012 designating the U.S., the entire content of which is hereby incorporated by reference in its entirety.

FIELD

The present disclosure relates to the field of power systems, such as installations for controlling and protecting the distribution of electric power. For example, a method, a computer program, a computer-readable medium and a system are disclosed for monitoring of primary devices in a power system.

BACKGROUND INFORMATION

In a power substation there can be a dozen or more primary devices, such as circuit breakers, power transformers and distribution transformers. The circuit breakers may vary in type, age and brand and may even include different parts. Hundreds of thousands of circuit breakers are in operation over the world.

Power substation equipment is to be very reliable and show a high availability. It has to be ensured that circuit breakers operate at all times in case of the desire for interruption or reconnection of power connections. High reliability and availability may be important as well for distribution transformers and power transformers in substations. Therefore, the quality of the primary devices can be checked regularly by a service technician to ensure this.

Power substations can be located in remote areas. The supervision of these remote power substations can be time and cost consuming. Between successive checks by a service technician, a probability of a component malfunction may increase, due to unavoidable degradation of the component or due to a particular operation, which would be detected only at the next service interval. Furthermore, in the case of a problem, a service technician may have to arrive at the power substation to determine the cause of the problem and to repair it. The required spare parts need to be available to him. Missing parts may be a problem leading to a delay of the repair.

Simple monitoring devices are known to monitor, based on operational diagnostic data, power substation equipment during operation. The monitoring devices may act as non-intelligent data loggers. Such monitoring devices can have only a static setup for thresholds and sampling of data. The data may then be communicated to a high level system and processed centrally.

Furthermore, more sophisticated but still locally operating diagnostic devices may be based on fixed rules that are entered during commissioning and reflect the specific type of installation. This can be done by setting specific limits or parameters. A deviation of operational diagnostic data from the given limits according to the fixed rules may be signalled as an alarm.

SUMMARY

A method is disclosed for monitoring primary devices of a power system, the method comprising: collecting operational diagnostic data from a first primary device, and determining health indicator data for the first primary device from readings of a sensor or from a result of a remote query, or from manual inspection, or from regular services performed by a human on the first primary device; identifying diagnostic correlation data from the health indicator data and correlated operational diagnostic data of the first primary device; adapting a diagnostic rule to the identified diagnostic correlation data, wherein the diagnostic rule is applicable to operational diagnostic data for determining a diagnostic warning indicative of a health state of a primary device; and providing a diagnostic warning of a second primary device by applying the adapted diagnostic rule to operational diagnostic data collected from the second primary device.

A computer program stored on a non-transitory computer-readable medium is disclosed for monitoring primary devices of a power system, which when executed by a processor of a first diagnostic device or of a central monitoring system, will perform steps of: receiving operational diagnostic data for a first primary device of the power system, and receiving health indicator data determined from readings of a sensor, or from a result of a remote query, or from manual inspection, or from regular services performed by a human on the first primary device; identifying diagnostic correlation data from the health indicator data and correlated operational diagnostic data of the first primary device; adapting a diagnostic rule to the identified diagnostic correlation data, wherein the diagnostic rule is applicable to operational diagnostic data for determining a diagnostic warning indicative of a health state of a primary device; and sending the adapted diagnostic rule to a second diagnostic device

BRIEF DESCRIPTION OF THE DRAWINGS

The subject matter disclosed herein will be explained in more detail in the following text with reference to exemplary embodiments which are illustrated in the attached drawings, wherein.

DETAILED DESCRIPTION

Figure 1:
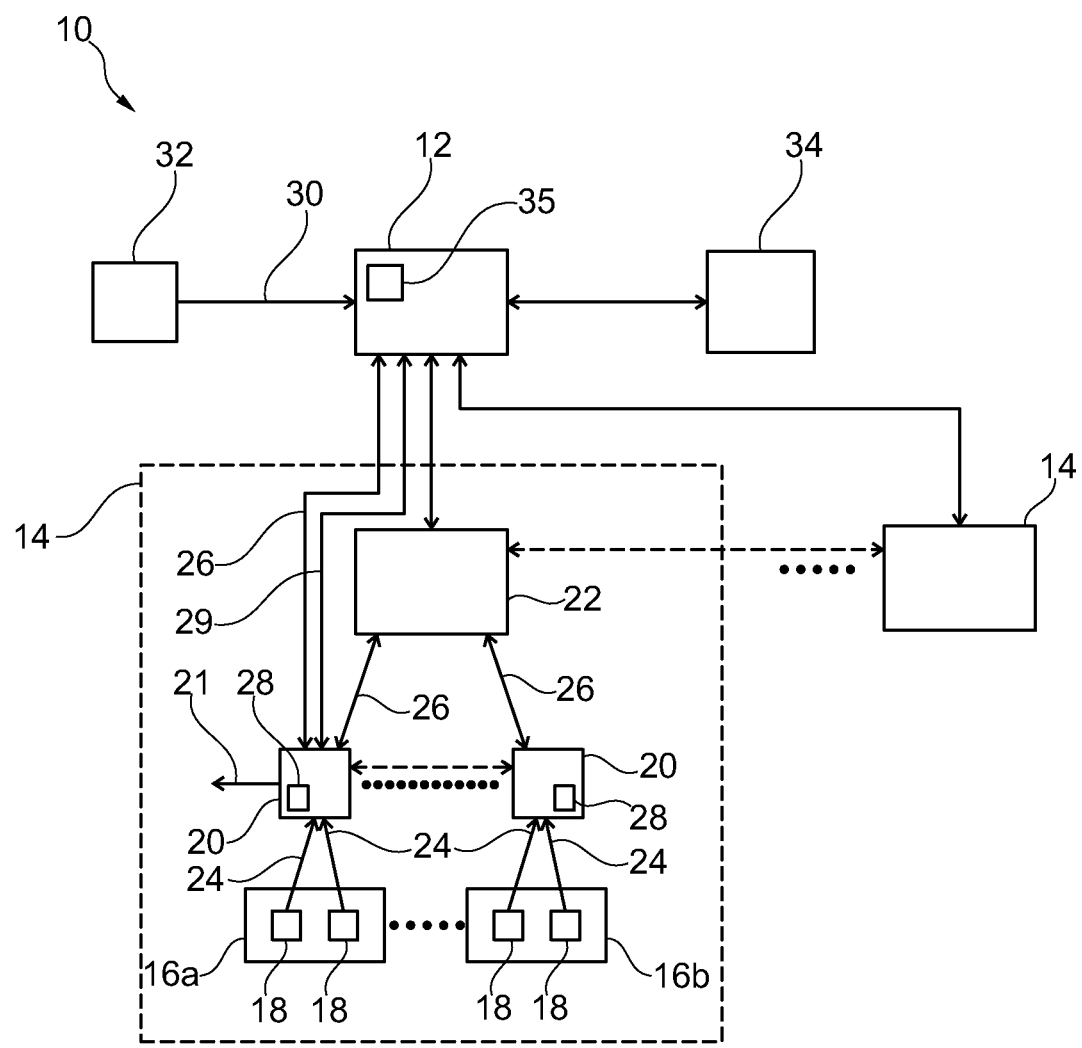
FIG. 1 schematically shows a diagnostic system according to an exemplary embodiment disclosed herein.

A locally operating monitoring or diagnostic device that supervises a circuit breaker may not get an automatic feedback from the high level system. Operational diagnostic data from the monitoring or diagnostic device can be stored more or less unprocessed and may later be collected and then analysed by a circuit breaker expert. The circuit breaker expert knows the characteristics of a properly working circuit breaker, for example the required speed of motion of a particular circuit breaker type, and may thus derive a health status or quality of the circuit breaker being supervised. The more circuit breakers have to be analysed, the more experts are needed. In addition, the knowledge of the expert is only available when the expert is analysing the data and not locally to signal a malfunction as it occurs.

Furthermore, the setting of parameters of a local diagnostic device may be difficult. If installation is done for a well-known system and by an expert, that expert will be able to enter reasonable parameters. If the installation is on the other hand done by non-experts, often only default values can be used. Default values may have the disadvantage that they have to be wide enough such that no false alarms are given and therefore are not very specific to occurring problems. In addition when installing a new system with new equipment the parameters for this equipment may not be known well enough. Similarly over time the behaviour of a system can change, and while a general slowing down over time due to material changes may be expected and accepted, a reduction of speed in a relatively new system may point to a problem.

An exemplary diagnostic system is disclosed that is adapted for providing updated diagnostic rules for a local diagnostic device, for better taking into account the aging or degradation of primary devices in a power substation, for taking into account the information of many primary devices of different power substations, and for automatically updating diagnostic rules.

An exemplary method is disclosed for monitoring primary devices of a power system. The power system may include a plurality of primary devices, for example components of medium voltage equipment, such as circuit breakers or transformers.

According to an exemplary embodiment disclosed herein, a method includes collecting operational diagnostic data from, or about, a first primary device. Operational diagnostic data may include a maximum temperature inside device housings of the primary device. It may include a mechanical wear of electric contacts of an electric device, for example a circuit breaker. It may include time behaviour of the current and/or voltage flowing through the primary device. It may include specific frequency components of a noise signal recorded at the primary device. Operational diagnostic data may include sensor data automatically generated by sensors coupled to the primary device. In short, operational diagnostics data may include temperature data, arcing current data, voltage data, or noise signal data. Operational diagnostics data may further include static auxiliary data about the use and operating conditions of the primary device. The operational diagnostic data may be generated either continuously or at fixed time intervals or at specific operations performed by the device.

The operational diagnostics data may also be collected from a plurality of similar (e.g., equally designed) primary devices, and subsequently evaluated statistically to produce reference operational diagnostic data. In this context, two primary devices are considered equally designed in case they are of a same type of equipment, include at least partly identical components, and/or are otherwise expected to generate à-priori comparable diagnostics data.

Primary devices may be associated with a diagnostic device or module that receives measurement data from sensors of the primary devices and that generates the operational diagnostics data. The plurality of primary devices may be seen as a fleet of devices monitored by the system. In such a way, the method may operate a diagnostic device system using a fleet diagnostic approach.

Health indicator data is additionally determined for selected primary devices. For example, the health indicator data may include information, whether the first primary device is operating correctly, whether it has failed completely, whether it has had a malfunction or whether its availability has been reduced. For example, the health indicator data may be determined from readings of an extra sensor), from the result of a remote query, or from occasional manual inspection or from regular services performed by a human on the selected primary devices in the field. Specifically, the health indicator data may include time of first observance and severity of any kind of error or contingency of the first primary device.

According to an exemplary embodiment disclosed herein, the method can include identifying diagnostic correlation data. The diagnostic correlation data may include health indicator data and correlated operational diagnostic data. The correlated operational diagnostic data is correlated or otherwise linked in a plausible manner with the health indicator data. For instance, the correlated operational diagnostic data may precede, time-wise, the occurrence of an error of the first primary device. In other words, operational diagnostic data may be investigated to identify signposts indicative of a forthcoming contingency. On the other hand the correlated operational diagnostic data may result from a statistical analysis of operational diagnostic data collected from a healthy primary device, or from a plurality of equally designed healthy primary devices.

According to an exemplary embodiment disclosed herein, the method can include adapting a diagnostic rule to the identified diagnostic correlation data, wherein the diagnostic rule is intended to evaluate operational diagnostic data for determining a diagnostic warning indicative of a critical health state of a primary device. For example, a diagnostic rule may be a comparison with a threshold value and the threshold value may be adapted to the correlated operational diagnostic data of the identified diagnostic correlation data. For example, when the correlated operational diagnostic data is a distribution of maximum temperatures of healthy primary devices, a threshold temperature may be derived. An existing threshold temperature may be reduced if the diagnostic correlation data indicates that correlated operational diagnostic data preceding a failure of the primary device has not exceeded the existing threshold.

The steps of identifying diagnostic correlation data and adapting a diagnostic rule may be executed at a central monitoring system that is communicatively connected to the primary devices or the local monitoring devices, respectively. Alternatively these steps may be executed at local diagnostic devices based on locally generated operational diagnostic data and health indicator data about the piece of primary equipment to which the diagnostic device is assigned. The adapted diagnostic rules as the outcome of these two steps may then be communicated from the central monitoring system, or in a peer-to-peer mode, respectively, to other diagnostic devices of a distributed supervisory system.

A diagnostic warning may be an alarm indicative of a particular (e.g., critical) health state of a primary device and/or its components, and include information about the device having an increased risk of failing. The diagnostic warning may be based on a diagnostic rule that may be applied to operational diagnostics data of a specific primary device. For example, the diagnostic rule may include a comparison of the operational diagnostic data of a specific primary device with a threshold value. The diagnostic rule may be a diagnostic routine that is applied to the operational diagnostic data. An original diagnostic rule that is stored in the device may be derived from occasional manual analysis or regular service of the primary device in the field and from static auxiliary data about the use and operating conditions of the first primary device.

According to an exemplary embodiment disclosed herein, the method can include providing a diagnostic warning of a second primary device by applying the adapted diagnostic rule to operational diagnostic data collected from the second primary device. To this end, the adapted or modified diagnostic rule (or only adapted parameters of the diagnostic rule) may be communicated or automatically forwarded to a second, or further, diagnostic device assigned to the second primary device. The adapted diagnostic rule may be used for calculating the respective diagnostic warning of the second primary device. To this end, operational diagnostic data about the second primary device may be locally evaluated by the second diagnostic device, according to the adapted diagnostic rule. In such a way, a future state of the second device, in particular a probable malfunction may be anticipated based on the history of one or many other equally or similarly designed primary devices in the system.

Summarized, in for example a large power system, statistically relevant operational diagnostics data may be collected from a plurality of primary devices, which may be equally or similarly designed. The collected data may be evaluated by a central monitoring system that automatically identifies, if the operational diagnostic data indicates that diagnostic rules should be changed. A modified diagnostic rule may then be sent to a diagnostic device assigned to a primary device, which then may apply the modified diagnostic rule to the operational diagnostic data of the assigned primary device.

A further aspect disclosed herein relates to a system computer program for monitoring of primary devices of a power system, which, when being executed by a processor of a first diagnostic device or of a central monitoring system, is adapted to perform the steps of: receiving operational diagnostic data from and health indicator data about a first primary device of the power system; identifying diagnostic correlation data from the health indicator data and correlated operational diagnostic data of the first primary device; adapting a diagnostic rule to the identified diagnostic correlation data, wherein the diagnostic rule is applicable to the diagnostic data for determining an diagnostic warning which indicates a diagnostic state of a primary device; and sending the adapted diagnostic rule to a second diagnostic device.

Features of exemplary methods as described herein may be features of the computer program and vice versa.

A further exemplary aspect disclosure herein relates a computer-readable medium, in which such a computer program is stored. For example, the computer program may be stored on a hard disk of the central monitoring system or on a CD, DVD or other non-volatile data carrier.

A further exemplary aspect disclosed herein relates to an industrial diagnostic system for monitoring primary devices of a power system. It should be understood that features of the method or the computer program as described herein may be features of the diagnostic system and vice versa.

According to an exemplary embodiment disclosed herein, the diagnostic system can include a first diagnostic device for collecting first operational diagnostic data from a first primary device; a second diagnostic device for collecting second operational diagnostic data from a second primary device; and a central monitoring system interconnected for data exchange with the first and second diagnostic device. The central monitoring system can be configured (e.g., adapted) for receiving the first operational data from the first diagnostic device, for identifying diagnostic correlation data from health indicator data and correlated operational diagnostic data of the first primary device; for adapting a diagnostic rule to the identified diagnostic correlation data, wherein the diagnostic rule is applicable to the diagnostic data for determining an diagnostic warning which indicates a diagnostic state of a primary device; and for sending the adapted diagnostic rule to the second diagnostic device. The second diagnostic device can be adapted for providing a diagnostic warning of the second primary device by applying the (adapted) diagnostic rule to the second operational diagnostic data.

These and other aspects disclosed herein will be apparent from and elucidated with reference to the exemplary embodiments described hereinafter with respect to FIGS. 1 and 2.

FIG. 1 shows an exemplary diagnostic system 10 with a central (condition) monitoring system 12 communicatively interconnected with a plurality of industrial sites 14, for example power substations 14.

At each site 14, a plurality of primary devices 16*a*, 16*b* are located. The primary devices 16*a*, 16*b* may include, for example, any kind of medium or high voltage equipment, such as a circuit breaker, a power transformer, a primary medium switch board, switch gear and/or a motor. The primary devices 16*a*, 16*b* which are monitored by the system 10 may be similar (e.g., equally designed). It should be noted that the primary devices 16*a* 16*b* may be located at different and/or remote industrial sites 14.

At least one sensor 18 is associated with a primary device 16*a*, 16*b*. The sensors 18 may be configured (e.g., adapted) for measuring all kind of physical quantities associated with the respective primary device 16*a*, 16*b*, for example current, voltage, temperature, noise, vibrations etc.

Furthermore, at each site 14, at least one diagnostics device 20 and optional a local server 22 can be located. The local server 22 of a site 14 may be adapted to communicate with the central monitoring system 12, for example through a large scale data network, and may be adapted to exchange data with other local servers 22 at other sites 14.

Each diagnostic device 20 is assigned to a primary device 16*a*, 16*b* and can be adapted for collecting or receiving measurement data 24 from the sensors 18 of the primary device 16*a*, 16*b*. The diagnostic device 20 may process the measurement data 24 for generating further diagnostics data 26. Each site 14 may include a plurality of diagnostics devices 20, which may be seen as data collectors 20 or data concentrators 20 of measurement data 24 and diagnostics data 26. Each diagnostics device 20 may be located close to the primary device 16*a*, 16*b* to be monitored.

Each diagnostic device 20 may include interfaces to the sensors 18 to generate primary signals 24 or measurement data 24 (e.g., mechanical travel time contacts, current and/or voltage signals, temperatures, oil status, gas pressure, coil continuity, aux. voltage, aux current, moisture, dust, . . . ). The operational diagnostic data 26 may include values of a physical quantity measured at the first primary device 16*a*.

Each diagnostic device 20 may be adapted to compress the primary sensor signals 24 and to derive further diagnostic data 26, from the primary signals 24. However, also the measurement data 24 may be diagnostic data 26. For example, diagnostic data 26 may be a partial discharge level or a cumulated contact wear. Summarized, the operational diagnostic data 26 may be based on measurement data 24 collected with at least one sensor 18 at a primary device 16*a*, 16*b*.

Each diagnostic device 20 may be adapted to apply diagnostic rules 28 to the measurement data 24 and/or the diagnostic data 26 to generate a diagnostic warning 21 and to create service-relevant information on the diagnostic state of the primary device 16*a*, 16*b*. The diagnostic warning 21 derived from the diagnostic rule 28 may be provided to other devices, for example an indicating device (e.g. LED, display) to give out state and service information of the primary device 16*a*, 16*b*.

Each diagnostic device 20 may include a communication interface for communicating with the local server 22 or directly with the central monitoring system 12.

Each diagnostic device 20 may be adapted to send measurement data 24 to the central monitoring system 12, to send compressed measurement data 24 to the central monitoring system 12 and/or to send diagnostic data 26 to the central monitoring system 12.

On the other hand, each diagnostic device 20 may be adapted to receive diagnostic rules 28 and other supporting information from the central monitoring system 12, such as updated rules, parameters, limits for values etc. Therefore, the central monitoring system 12 can be adapted for sending update information 29 to a diagnostic device 20.

A diagnostic device 20 does not necessarily have to be communicatively connected to the central system 12 (or the other devices, for example 22) all the time. In this case, the monitoring system 12 may be still working even if the diagnostic device 20 is not online 100% or partially off-line. A permanent connection may not be necessary. The communication may be event driven or periodical. The communication may be initiated by the diagnostic device 20 after new data 24, 26 has been collected (e.g., after a switching operation of a circuit breaker 16a, 16b only). The communication may be initiated after a certain time interval, or another event (e.g., after 10 operations of the primary device 16a, 16b). The communication may be initiated by a personal intervention, of either the owner of the equipment, (i.e., the substation owner, or a service technician) for example via a laptop connection).

A diagnostic device 20 may be adapted to exchange diagnostic data 26 or an adapted diagnostic rule 28 with another diagnostic device 20.

The central monitoring system 12 may be further adapted to receive offline-information 30 from offline input devices 32, for example a laptop of a service technician. The off-line information 30 may include additional measurements made during service. Online data 24, 26 (data from the diagnostic devices 20) and offline data 30 may be combined for better analysis.

The measurement data 24, the diagnostic data 26 and the offline-information 30 sent to the central monitoring system may be stored in a database 34. The diagnostic system 10 may include at least one (central) database 34 adapted for storage of data collected by the various diagnostic devices 20, for storage of specific data of primary devices 16a, 16b (e.g., type, installation details, fabrication data, replacement of parts . . . ) and/or for storage of information 30 gathered by service personnel by additional measurements during service.

The central monitoring system 12 is adapted to process the data stored in the database 34 for identifying the need to modify or adapt a diagnostic rule 28. For example, the central monitoring system 12 can be adapted for identifying a diagnostic indicator 35 from the data stored in the database 34.

The central monitoring system 12 may be furthermore adapted to feed the database 34 with supporting information, reports from service incidents, not necessarily connected to one of the systems managed by the diagnostic system 10, reports from failures in the field and "post mortem" analysis information, power product base data (e.g., type, installation details, fabrication data, parts by year . . . ) and/or with specific information about certain type of primary devices 16a, 16b, which may be added from external investigations (e.g. if a large fleet of primary devices 16 is included and more specific/precise predictions are wanted).

The central monitoring system 12 may be adapted to exploit the database 34, for example to statistically evaluate the information in the database 34, to derive diagnostic rules 28 for diagnostic devices 20 such that these can be used for stand-alone.

The central monitoring system 12 may be adapted to feed parameters, limits for diagnostic rules 28 or new rules itself into the database 34 for latter update by the diagnostic devices 20.

The central monitoring system 12 may be adapted to rang the different primary devices 16a, 16b according to their reliability or their status.

The central monitoring system 12 may be adapted to search for increased failure/problem rates in specific primary devices 16a, 16b, which, for example, may not have been covered with existing diagnostic, but could be used to.

The central monitoring system 12 may be adapted to provide extra services (abnormal failure of specific primary devices 16a, 16b, high failure of certain primary devices 16a,16b only under specific operating conditions).

It should be noted that the central monitoring system 12 may communicate to at least thousands of diagnostic devices 20 (e.g., thousands of primary devices 16a, 16b may be monitored and operational diagnostic data 26 may be collected from a plurality of primary devices 16a, 16b). The knowledge from the fleet of primary devices 20 may be used for a better diagnostic of an individual local primary device 16a, 16b. Since the evaluation of the data 24, 26 and the adaption of the diagnostic rules 28 may be performed automatically by the system 10, a device expert may not have to analyse thousands of individual devices 16a, 16b. With the system 10, diagnostic rules 28 may be adjusted over time. Furthermore, new diagnostic rules 28 may be designed and downloaded to the diagnostic devices 20.

The central monitoring system 12 may receive the diagnostic data 26 from a first (or a plurality of first) diagnostic devices 20, may adapt a diagnostic rule 28 according to the diagnostic data and may send the data to a second diagnostic device 20. In other words, it is not necessary that the diagnostic rule is updated in the same diagnostic device 20 from which the diagnostic data 26 comes from.

Method Overview

In the following, exemplary operation of the diagnostic system 10 will be explained with respect to FIG. 2.

In step S10 operational diagnostic data 26 is collected from at least one primary device 16a, 16b.

Measurement data 24 may be measured with a sensor 18 on a part of the equipment of a substation, (e.g., a primary device 16a, 16b). The measurement data 24 may be quite general, but always with the aim to assess the diagnostic state of the primary device 16a, 16b. The measurement data 24 may be collected only during operation of the primary device 16a, 16b. However, the measurement may also be a continuous measurement. The diagnostic data 26 may be either derived or calculated from the measurement data 24 by the diagnostic device 24 or may be or may comprise the measurement data 24.

Examples for diagnostic data 24 are different time stamps during the opening or closing of a circuit breaker 16a, 16b, for example, the time of the drive of the circuit breaker 16a, 16b from initiation to a movement of the mechanics. Other examples for diagnostic data 24 are the time and the speed of the mechanics to open the contacts of the circuit breaker 16a, 16b. Another diagnostic data 24 may be the current during arcing, during opening of the contacts of the circuit breaker 16a, 16b. Further possible diagnostic data 26 may include continuous measurements 24 like a monitoring of temperature, the humidity of a gas or the pressure in the case of a transformer 16a, 16b.

Operational diagnostic data 26 may be diagnostics data that is based on measurements on a primary device 16a, 16b during the operation of the primary device 14.

In step S12, a diagnostic warning 21 of the primary device 16a, 16b is provided. A diagnostic warning may be a signal for signalling that the primary device 16a, 16b may have a problem. The diagnostic warning 21 may indicate a diagnostic state of the first primary device 16a, 16b. The diagnostic device 20 may signal a local user the current quality of the attached primary device 16a, 16b or may provide (local) warnings.

The diagnostic warning 21 may be generated by a local analysis of a diagnostic device 20. The diagnostic device 20 may process the diagnostic data 26 and may apply at least one diagnostic rule 28 to the operational diagnostic data 26 for generating the diagnostic warning 21.

In step S14, the diagnostic data 26 is sent to the central monitoring system 12 by the diagnostic device 20, for example indirectly via the local server 22. This step may be repeated by a plurality of diagnostic devices 20 assigned to different primary devices 16a, 16b and/or located at different sites 14.

A diagnostic device 20 may be seen as a low level system. The central monitoring system may be seen as a high level system. In such a way, the diagnostic data 20 of a plurality of low level systems 20 may be sent to a central high level system 12.

Either raw data 24 or pre-processed data 26 from the attached primary device 16a, 16b may be sent to the central monitoring system 12. The diagnostic data 26 may also be distributed to a non-centralized system (e.g., peer to peer), for example to other diagnostic devices 20 or to other sites 14.

After that, the data 24, 26 sent to the central monitoring system 12 may be stored in the database 34 for further processing by the central monitoring system 12.

In step S16, additional off-line data 30 may be sent to the central monitoring system 12, for example through an additional input channel 32, like the laptop of a service technician.

Additional information or data 30 about individual primary devices 16a, 16b may be input to the central monitoring system 12 from other offline sources 32. Offline data may be data that is not sent through a communication network from the diagnostic device 20 to the central monitoring system 12. For example, sources 32 may be a database containing product information or the result of investigations of service technicians. The offline data 30 may be stored in the database 34 by the central monitoring system 12 and its relation to the automatically, online sent diagnostic data 26 may be provided.

In step S18 the operational diagnostic data 26 may be evaluated and at least one diagnostic rule 28 may be adapted or modified in the central monitoring system 12. In other words, the diagnostic data 26 and other equipment data 30 may be processed in the high level system 12.

For example, the diagnostic data 26 of all attached primary devices 16a, 16b (the whole fleet) is processed on the high level system 12.

The central monitoring system 12 can then calculate a diagnostic indicator 35 from the diagnostic data 36 stored in the database 34 and identifies a change in the diagnostic indictor 35.

The diagnostic data 26 may include data sets, wherein each data set is related to an operational event of the first primary device 16a, 16b. As an example, a data set may be a time line of current values measured during the event of opening a circuit breaker 16a, 16b. For each data set, the respective diagnostic indicator 35 may be determined. For example, the diagnostic indicator 35 may be the wear of electric contacts that may be determined from the time line of current values based on a model of the circuit breaker 16a, 16b. The change of the diagnostic indicator 35 may then be identified by comparing diagnostic indicators 35 of different datasets. For example, the central monitoring system 12 may identify that circuit breakers 16a, 16b at a specific site 14 have a higher wear of electric contacts as compared to other sites (for example, because due to the climatic conditions at the site 14).

The central monitoring system 12 may then modify or adapt the diagnostic rule 28. For example, a diagnostic rule 28 for issuing a warning with respect to the life time of electrical contacts of a circuit breaker 16a, 16b may be adapted to the predicted shorter life time (due to the higher wear) and sent to the primary devices of the specific site 14.

The change in the diagnostic indicator 35 may be identified with a statistical evaluation of the diagnostic data and/or with a model based evaluation of the diagnostic data 26. Furthermore, additional offline data 30 related to the primary device 16a, 16b may be used for identifying the change in the diagnostic indicator 35.

In these cases, different statistical or model based algorithms may be used to analyse the individual primary devices 16a, 16b, to detect the change in the diagnostic identifier 35 and to find improvements of the diagnostic rules 28 used to assess the quality of the primary devices 16a, 16b.

The local diagnostic rules 28 to be used in the local diagnostic devices 20 may be optimized with the overall knowledge of the fleet of primary devices.

In step S20, the adapted or modified diagnostic rule 28 is sent to a diagnostic device 20. It has to be noted that a (second) diagnostic device 20, the modified diagnostic rule 28 is sent to, need not be a (first) diagnostic device 20, from which diagnostic data 26 was received. However, the modified diagnostic rule 28 may be sent to all diagnostic devices 20 connected to the diagnostic system 12. Improved diagnostic rules 28 for individual local diagnostic devices 20 are communicated back to them.

The modified diagnostic rule 28 may be sent to a diagnostic device 20 by sending modified (e.g., improved) parameters back to the diagnostic device 20, for example an modified threshold value.

The improvements to diagnostic rules 28 sent to a diagnostic device 20 may include new rules 28, new or adapted data analysis functions for existing diagnostic rules 28, and/or adapted parameters of existing rules 28. This may enable the local diagnostic device 20 to modify (e.g., improve) their diagnostic capabilities based on the experience made on a multitude of other primary devices 16a, 16b, even if the diagnostic device 20 is offline most of the time, thus operating independent from the high level system 12.

This improvement possibility of diagnostic rules 28 may, for example, become important, if the original models and assumptions for life time prediction of a primary device 16a, 16b turn out not to be true, (e.g., if due to production quality issues the life time of a lot of primary devices 16a, 16b is significantly reduced as compared to similar primary devices 16a, 16b under similar or identical operating conditions). In that case, the local diagnostic rules 28 may be adapted on those diagnostic devices 16a, 16b only that analyse a primary device 16a, 16b with a faulty component.

The diagnostic device 20 that received the adapted diagnostic rule 28 may then provide an improved diagnostic warning 21 of a further primary device 16a, 16b by applying the adapted diagnostic rule 28 to operational diagnostic data 26 collected for the further primary device 16a, 16b.

In step S22, the central monitoring system 12 may generate a report based on the modified diagnostic rules 28. The overall fleet status of the primary devices 16a, 16b may be reported in this way. Within such a report, the quality of each primary device 16a, 16b may be stated and features to improve their quality may be indicated.

In the following, three exemplary different embodiments of the method described herein are specified with respect to a circuit breaker 16a, 16b and specific diagnostic data 26. Only the relevant specific aspects with respect to the individual steps S10 to S22 are mentioned. Although, all three embodiments are coming from the area of monitoring medium voltage primary devices, the general method should not be seen to be exclusive to this technical field.

Temperature Monitoring

A first exemplary embodiment relates to temperature monitoring.

Primary devices 16a, 16b, such as circuit breakers 16a, 16b, are equipped with one or more temperature sensors 18 in order to protect them from overheating. The primary devices 16a, 16b may have a simple maximal temperature, which is used to indicate possible failure or malfunction of the primary devices 16a, 16b. Still the temperature measured in this way may not necessarily be the highest temperature in the primary device 16a, 16b, if for example areas with the highest temperature are not easily accessible. In addition, the threshold value for the temperature may have to be set in a way, that it covers a large number of problems.

Figure 2:
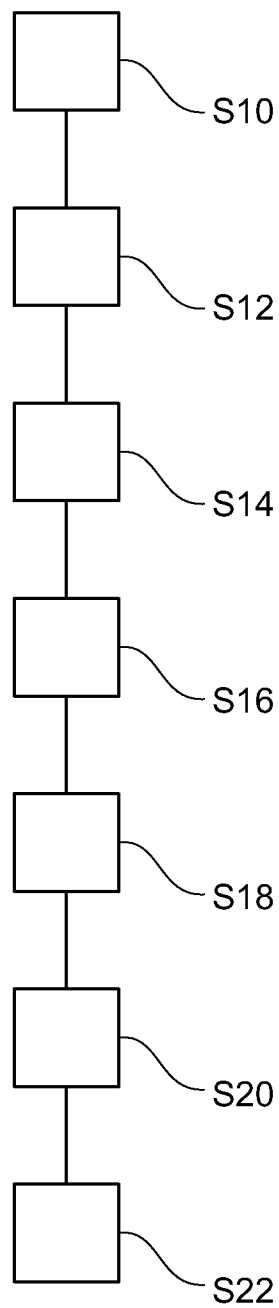
FIG. 2 shows a flow diagram for a method of monitoring diagnostic rules of a power system according to an exemplary embodiment disclosed herein.

With respect to FIG. 2, in step S10, the measurement data 24 can include measurement values of temperature. The temperature may be measured continuously and the measurement data may include time series of measurement values. The temperature may be measured only or in connection with other properties. For example, by measuring in addition the current flowing through the circuit breaker 16a, 16b, the temperature may be related with an estimated total heating power due to, for example Ohmic heating coming from contact resistances.

In step S12, the following diagnostic rules 28 may be applied to the temperature data 24, 26: A simple local analysis may determine, whether the temperature measured is reaching a maximal value. An error may be indicated, if the temperature reaches a temperature for a certain length of time, or if the temperature is above the one temperature expected from the Ohmic heating, determined from the current measurement. The ambient temperature may be taken into account as well. Similarly to the modeling that is done in transformers, a simple heat flow model may be solved and used as a basis to predict overheating in other parts of the compartment.

For example, the measurement data 24 may include time lines of temperature values and the diagnostic data 26 may include temperature values derived from the measurement values and/or Ohmic heating data.

In step S14, the temperature data 24, 26 may be stored and may be sent to the central monitoring system 12. This may be done for the temperature 24 only or together with, e.g., Ohmic heating data 26. The data may be preprocessed and compressed (e.g., only maximal/minimal/average temperatures may be sent).

In step S16, heat coming from adjacent compartment may be important in the analysis, since each circuit breaker 16a; 16b may be mounted in a different type of compartment. By complementing this data with stored data for the installation environment, this can be accounted for. Additional sensors 18 may be installed on some primary devices 16a, 16b and the temperature distribution in a whole compartment may be analyzed. Similarly errors occurring in a primary device 16a, 16b may be analyzed, if a repair is necessary, and the position of any overheating determined.

In step S18, the data of a large fleet of circuit breakers 16a, 16b may be analyzed together with the additional data 30 from other channels 32. In a simple approach, the maximal temperature for the different parts of a circuit breaker 16a, 16b may be adjusted, based on the experience so far. For example, if problems occur at temperatures below the maximal threshold used so far, the threshold may be lowered.

In addition, new diagnostic rules 28 may be derived from the measured temperatures in circuit breakers which experienced problems. For example, the maximal time a circuit breaker 16a, 16b should be at a certain temperature may be determined and/or modified.

As an example for a more detailed model, the Ohmic heating may be better determined, especially for aged contacts, as data from the field becomes available. Accordingly, a more precise assessment of the Ohmic contribution to the total (measured) temperature may be possible, possibly resulting in an increased threshold (if the Ohmic contribution is found to increase with time).

More complex models predicting maximal temperatures in the compartment, similar to the predictions done in transformers may be done here as well. These models may be tuned by using the set of data available for similar installations. From all of these investigations new models and diagnostic rules 28 may be derived.

In step S20, the update models and diagnostic rules 28 may be sent to the diagnostic device 20. They are then used for improved monitoring and diagnostics. The diagnostic rules 28 may either be already defined (e.g., be a simple maximal temperature threshold, a correction algorithm, which predicts temperatures due to contact resistances, where only the parameters of the algorithm are updated), or completely new diagnostic rules 28 in a formal format may be added to the diagnostic device 20 (for example, a thermal model could be changed in its functional form). These updates may for example occur either during regular communication (e.g., via an existing network), or are installed in the system 20 automatically, if a service technician checks the diagnostic device 20.

In step S22, in addition, the fleet data may also be further processed in the central monitoring system 12. The overall status based on the temperatures currently seen may be assessed and reported.

Contact Wear Monitoring

A second exemplary embodiment relates to contact wear monitoring from current measurements.

An exemplary indirect measurement of the contact wear is done by measuring the current flowing through the circuit breakers 16a, 16b during the arcing phase. During this time, metal is evaporated from the electrodes and the contacts get thinner. The contact force is reduced, until finally the circuit breakers 16a, 16b will overheat due to the increased contact resistance. The contact quality can be derived from the current measured as a function of time during contact opening. For example, switching can be done only very rarely, such as under short circuit current conditions, and at times, which cannot be predicted in advance.

With respect to FIG. 2, in step S10, the current is measured as a function of time during opening of the circuit breakers 16a, 16b. In addition some data can be measured, which is related to the contact travel curve. The measurement data 24 may include a time series of current values and/or the status of the open and close indicator and the instances in time, when these indicator changes.

In Step S12, the data may be analysed by determining on the one hand the time interval of arcing. The start of this time interval may be derived from the contact travel measurements using the open and close indicator. The end of the arcing period may be determined from the current flowing through the circuit breaker 16a, 16b, that is, determining when this current is below a certain threshold value for some time. The current flowing through the arc during this time is used to calculate a contact ablation. An arc in a vacuum interrupter 16a, 16b may undergo a number of different stages, and phases and ablation should be adjusted accordingly.

For example, the diagnostic data 26 may include the beginning and the end of the arcing period and the contact ablation.

In step S14, either the full set of currents measured during the arcing phase may be sent to the central monitoring system 12. Alternatively some processed data (e.g., some moments), such as the integrated current to some power, may be calculated and sent only in order to reduce the amount of data transmitted.

In step S16, in addition, the real contact wear may be determined during inspections of the primary devices 16a, 16b, after a number of operations have happened. If circuit breakers 16a, 16b are returned for repair or service into the factory the contact wear may also be measured. Problems with breakers, which have been used beyond their life time may be used to indicate the quality of the algorithm. These additional data 30 may be taken into account while evaluating the diagnostic data 26.

In step S18, the high level system 12 may try to enhance (e.g., optimize) the parameters of the contact wear algorithm. The time duration of the different arcing phases, as well as, the dependence of the contact wear on the current itself may be adjusted. Due to the fleet analysis, a large number of data for contact wear under different conditions may be available, which may not be measured in a lab setup. Due to the small number of events measured in such a fleet, the collection of the data of a large number of circuit breakers 16a, 16b may be needed to get to a statistical significant amount of data.

In step S20, if the parameters of the contact wear algorithm are adjusted, they may be sent back to the circuit breaker 16a, 16b for future use. In addition, the reanalysed contact wear, or better the contact quality, calculated as good as possible from the transmitted data may also be updated. These may be used for a better indication of the end of life of the circuit breaker 16a, 16b.

In step S22, a reporting of the overall fleet status may be done in addition. Service scheduling and even replacements may be planed from the knowledge of the status of a large number of circuit breakers 16a, 16b.

In the following an example for a diagnostic rule 28 for determining the contact quality or contact wear is provided.

For example, for circuit breakers 16a, 16b a diagnostic rule 28 may be used to derive the contact quality Q based on the contact current during opening of the contacts. The diagnostic rule 28 is based on the following formula:

$$Q = 1 - A \int_{Arching} I(t)^B \, dt$$

With respect to the above described method, in step S12, B is equal to 2, for example determined from earlier measurements.

The current I (diagnostic data 26) has been measured during step S10 on a local circuit breaker 16a, 16b and the diagnostic device 16a, 16b derives the contact quality during the operation of the circuit breaker 16a, 16b with the aid of the formula. The quality Q a basis for the diagnostic warning 21 is signalled locally on the diagnostic device 20.

In step S18, on the high level system 12 diagnostic data 26 from for example thousands of circuit breakers 16a, 16b and other equipment is collected. The high level system 12 may be a server on site or also a distributed system that allows a fleet view. In the system 12, the fleet data is analysed. Primary devices 16a, 16b of the same kind or type may be grouped according to the serial number or according to the data 24, 26 measured or by a database entry. The system 12 then identifies that the contact quality of one circuit breaker kind is lower than estimated in the local diagnostic devices 20 due to the fact that electric contacts failed when they had an official quality above 0. It may also be a measurement of a contact that shows that the wear is more than expected. In other words, the wear of thousands of circuit breaker may be used as diagnostic indicator 35.

The knowledge about the diagnostic indicator 35 can be used to optimize the parameters A and/or B to a new value. The formula and the diagnostic rule 28 can be adapted based on the identified change in the diagnostic indicator 35.

In step S20, the new rule parameter A and B is transmitted to the individual diagnostic devices 20. After that, the diagnostic devices 20 use a different diagnostic rule 28 for the future.

Monitoring of a Charging Motor

A third exemplary embodiment relates to the analysis of a charging motor of a spring.

A further component of a circuit breaker 16a, 16b, which may fail is a spring charging motor. These motors may overheat during operations or stop working after a larger number of operations. Similarly the spring, that is used, to operate the mechanical opening and closing, may change over time. The mechanics itself may develop problems. In this embodiment, the sensor 18 may be an acoustical sensor and the measurements may be acoustic measurements. The noise of the motor during charging may be recorded and may be analysed for abnormal conditions. As an alternative, the power into the motor may be recorded, time resolved and analysed.

With respect to FIG. 2, in Step S10, a microphone 18 may record the noise signal from the charging of the motor. Alternatively or additionally, the power into the motor or current and voltage at the motor may be measured.

In step S12, from current and voltage or the power input the total energy needed to charge the spring may be determined. The total energy may be compared with the required energy in the spring. Both a too high and a too low energy can be indications of problems. A power required as a function of time may be compared with a table stored in the diagnostic device 20. The acoustic signal may be analysed using a number of signal processing steps in order to detect the presence of certain disturbances. For example, the presence of a strong signal at specific frequencies may indicate strong frictions. The regularity of the "clicking" of the locking mechanism in the spring charging mechanics may be analysed.

The measurement data 24 may include a time series of acoustic signals and a time series of power, current and/or voltage values. The diagnostic data 26 may include the total energy and the position of s strong signal in the frequency spectrum.

In step S14, the recorded or collected measurement data 24 and diagnostic data 26 are sent to the central monitoring system 12. For example, in the case of the recorded power, either the time series or an energy required in certain time intervals may be sent. Similarly, a parameterization of the curve may be done for a number of charging operations and these parameters may be sent only. With the acoustic recording, the whole signal may be sent as time series or as a Fourier transformation.

In step S16, the central monitoring system 12 determines from the database 34 the type of motor installed as additional data 30. Motors from different suppliers may show different behaviour, so this information may be important. If failures occur, the motor may be replaced. The fault may be determined afterwards and classified. Also the number of charging operations may be determined as well.

In step S18, in both cases, the power measurement and the acoustic analysis may be provided to machine learning techniques. An aim can be to classify the signals according to the status of the motor. The data recorded may be the input to train the system. Exemplary classification algorithms, (e.g., based on neural networks) may be trained and their parameter extracted. Similarly the limits of the energy needed to charge the spring can be determined.

In step S20, after the analysis, the parameters of either the classification algorithm or the minimal or maximal energies are sent back to the diagnostic device 20. Using them, the analysis of the motor may be improved as they may be automatically adjusted to the different motor types without requiring extensive tests in a lab.

In Step S22, a status of the different motors may be reported. Scheduling of replacements may be done.

Summarized, the method and the system 10 may have the following exemplary advantages:

The method and the system 10 may be used for primary devices 16a, 16b with a well understood behaviour and with primary devices 16a, 16b with very little knowledge on lifetime behaviour. Diagnostic data 26 of larger groups of such devices 16a, 16b may be statistically evaluated, creating diagnostic rules 28 by a statistical evaluation on system level and downloading of those rules 28 to the diagnostic devices 28.

If there is a need or desire to evaluate a large fleet of little understood primary devices 16a, 16b, specific information can be collected centrally and automatically by specific measurements, which are then updated to all the diagnostic devices 20.

The diagnostic system 10 may be non-static. The diagnostic system 10 may learn from the experiences (failures, malfunction, unusual behaviour) made within one group of primary devices 16a, 16b to constantly tune threshold values for diagnostic rules 28 and therefore minimize the number of false negatives as well as false positives over time.

Due to the evaluating of additional offline data 30, experiences of service technicians may be recorded and considered after initial installation of the diagnostic system 10.

The information gathered in the application cases considered here may not be periodic, predictive or specifically initiated, that is, data collection may be started in many cases by externally initiated events ("faults", "short circuits"), which in addition may be often only very rare.

The diagnostic indications of a diagnostic device 20 may be improved based on failures of similar primary devices 10 with similar parameters. This may result in early warning on failures.

Effect of aging on a primary component 16a, 16b may be taken into account. After a long time of operation, diagnostic rules 28 or parameters may be different, but may be updated later.

The exemplary method and system 10 opens the possibility to generate "fleet status reports", that is, a ranking of all the primary devices 16a, 16b within the fleet, allowing an operator to identify critical/unreliable primary devices 16a, 16b.

While exemplary embodiments have been illustrated and described in detail in the drawings and foregoing description, such illustration and description are to be considered illustrative or exemplary and not restrictive; the disclosure is not limited to the disclosed embodiments. Other variations to the disclosed embodiments can be understood and effected by those skilled in the art from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

It will therefore be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A method for monitoring primary devices of a power system via diagnostic devices, the method comprising:
   in a first diagnostic device:
      collecting operational diagnostic data from a first primary device, and determining health indicator data for the first primary device from readings of a sensor, or from a result of a remote query, or from manual inspection, or from regular services performed by a human on the first primary device;
      identifying diagnostic correlation data from the health indicator data and from correlated operational diagnostic data of the first primary device, which correlated operational diagnostic data is linked with the health indicator data;
      adapting a diagnostic rule to the identified diagnostic correlation data, wherein an original diagnostic rule is modified by calculating a change in a diagnostic identifier associated with operational data of the first primary device and is applicable to operational diagnostic data for generating a diagnostic warning indicative of a health state of the primary device;

communicating the adapted diagnostic rule to a second diagnostic device; and in the second diagnostic device:

generating a diagnostic warning of a second primary device by applying the adapted diagnostic rule of the first diagnostic device to operational diagnostic data collected from the second primary device.

2. The method of claim 1, comprising:

indicating an error via the health indicator data of the identified diagnostic correlation data of the first primary device, wherein correlated operational diagnostic data precedes the error.

3. The method of claim 1, comprising:

collecting the operational diagnostic data from a plurality of similar first primary devices, and determining health indicator data for the plurality of similar first primary devices.

4. The method of claim 3, comprising:

identifying the correlated operational diagnostic data with a statistical evaluation of operational diagnostic data from the plurality of similar first primary devices.

5. The method of claim 3, comprising:

locating at least two of the primary devices at different industrial sites.

6. The method of claim 1, comprising:

relating the operational diagnostic data to an operational event of the first primary device.

7. The method of claim 1, comprising:

collecting the operational diagnostic data with at least one sensor at the first primary device.

8. The method of claim 1, comprising:

basing the operational diagnostic data on a physical quantity measured at the first primary device.

9. The method of claim 1, comprising:

collecting the operational diagnostic data with the first diagnostic device;

sending the operational diagnostic data to a central monitoring system;

identifying diagnostic correlation data and adapting the diagnostic rule in the central monitoring system; and sending the modified diagnostic rule to the second diagnostic device.

10. The method of claim 1, comprising:

basing the diagnostic rule on a comparison between a threshold value and an actual value calculated from the operational diagnostic data, wherein the diagnostic rule is adapted by modifying the threshold value.

11. The method of claim 1, wherein the correlated operational diagnostic data includes additional offline data related to the first primary device.

12. The method of claim 1, wherein the first and second primary devices are medium voltage devices.

13. A computer program stored on a non-transitory computer-readable medium for monitoring primary devices of a power system, which when executed by a processor of a first diagnostic device or of a central monitoring system, will perform steps of:

receiving operational diagnostic data for a first primary device of the power system, and receiving health indicator data determined from readings of a sensor, or from a result of a remote query, or from manual inspection, or from regular services performed by a human on the first primary device;

identifying diagnostic correlation data by linking the health indicator data of the first primary device with correlated operational diagnostic data of the first primary device;

adapting a diagnostic rule to the identified diagnostic correlation data, wherein an original diagnostic rule is modified by calculating a change in a diagnostic identifier associated with the operational data of the first primary device and is applicable to operational diagnostic data for generating a diagnostic warning indicative of a health state of a primary device; and sending the adapted diagnostic rule to a second diagnostic device for generating a diagnostic warning of a second primary device.

14. A system comprising:

a non-transitory computer-readable medium, in which a computer program according to claim 13 is stored; and a computer processor of a first diagnostic device or of a central monitoring system for executing the computer program.

15. The method of claim 13, comprising:

relating the operational diagnostic data to an operational event of the first primary device.

16. The method of claim 15, comprising:

collecting the operational diagnostic data with at least one sensor at the first primary device.

17. The method of claim 16, comprising:

basing the operational diagnostic data on a physical quantity measured at the first primary device.

18. The method of claim 17, comprising:

collecting the operational diagnostic data with the first diagnostic device;

sending the operational diagnostic data to a central monitoring system;

identifying diagnostic correlation data and adapting the diagnostic rule in the central monitoring system; and sending the modified diagnostic rule to the second diagnostic device.

19. The method of claim 18, comprising:

basing the diagnostic rule on a comparison between a threshold value and an actual value calculated from the operational diagnostic data, wherein the diagnostic rule is adapted by modifying the threshold value.

20. The method of claim 19, comprising:

wherein the correlated operational diagnostic data includes additional offline data related to the first primary device.

* * * * *